(12) United States Patent
Pan et al.

(10) Patent No.: US 10,787,584 B2
(45) Date of Patent: Sep. 29, 2020

(54) PRINTING INK AND ELECTRONIC DEVICE

(71) Applicant: Guangzhou ChinaRay Optoelectronic Materials Ltd., Guangzhou (CN)

(72) Inventors: Junyou Pan, Guangzhou (CN); Xi Yang, Guangzhou (CN)

(73) Assignee: GUANGZHOU CHINARAY OPTOELECTRONIC MATERIALS LTD., Guangzhou (CN)

(*) Notice: Subject to any disclaimer, the term of this patent is extended or adjusted under 35 U.S.C. 154(b) by 349 days.

(21) Appl. No.: 15/751,636

(22) PCT Filed: Jul. 5, 2016

(86) PCT No.: PCT/CN2016/088636
§ 371 (c)(1),
(2) Date: Feb. 9, 2018

(87) PCT Pub. No.: WO2017/028638
PCT Pub. Date: Feb. 23, 2017

(65) Prior Publication Data
US 2018/0237649 A1 Aug. 23, 2018

(30) Foreign Application Priority Data
Aug. 14, 2015 (CN) .......................... 2015 1 0501235

(51) Int. Cl.
| | | |
|---|---|---|
| *C09D 11/36* | (2014.01) | |
| *H01L 51/00* | (2006.01) | |
| *C09D 11/322* | (2014.01) | |
| *C09D 11/52* | (2014.01) | |
| *H01L 29/775* | (2006.01) | |
| *H01L 31/0352* | (2006.01) | |
| *H01L 33/06* | (2010.01) | |
| *H01L 51/50* | (2006.01) | |
| *H01S 5/34* | (2006.01) | |
| *H01L 29/06* | (2006.01) | |
| *H01S 5/10* | (2006.01) | |
| *H01S 5/36* | (2006.01) | |
| *H01L 29/12* | (2006.01) | |
| *H01L 33/50* | (2010.01) | |

(52) U.S. Cl.
CPC ............ *C09D 11/36* (2013.01); *C09D 11/322* (2013.01); *C09D 11/52* (2013.01); *H01L 29/775* (2013.01); *H01L 31/035218* (2013.01); *H01L 33/06* (2013.01); *H01L 51/00* (2013.01); *H01L 51/0007* (2013.01); *H01L 51/502* (2013.01); *H01S 5/34* (2013.01); *H01L 29/0669* (2013.01); *H01L 29/127* (2013.01); *H01L 33/502* (2013.01); *H01L 51/0004* (2013.01); *H01S 5/1067* (2013.01); *H01S 5/36* (2013.01); *Y02E 10/549* (2013.01)

(58) Field of Classification Search
CPC .............................. C09D 11/36; C09D 11/322
See application file for complete search history.

(56) References Cited

U.S. PATENT DOCUMENTS

| | | |
|---|---|---|
| 6,207,229 B1 | 3/2001 | Bawendi et al. |
| 6,251,303 B1 | 6/2001 | Bawendi et al. |
| 6,319,426 B1 | 11/2001 | Bawendi et al. |
| 6,426,513 B1 | 7/2002 | Bawendi et al. |
| 6,576,291 B2 | 6/2003 | Bawendi et al. |
| 6,607,829 B1 | 8/2003 | Bawendi et al. |
| 6,861,155 B2 | 3/2005 | Bawendi et al. |
| 6,921,496 B2 | 7/2005 | Anderson et al. |
| 7,060,243 B2 | 6/2006 | Bawendi et al. |
| 7,125,605 B2 | 10/2006 | Bawendi et al. |
| 7,138,098 B2 | 11/2006 | Bawendi et al. |
| 7,150,910 B2 | 12/2006 | Eisler et al. |
| 7,470,379 B2 | 12/2008 | Anderson et al. |
| 7,566,476 B2 | 7/2009 | Bawendi et al. |
| 7,615,800 B2 * | 11/2009 | Kahen ................ B82Y 10/00 257/103 |
| 7,811,479 B2 * | 10/2010 | Drndic .............. B82Y 10/00 136/250 |
| 2007/0225402 A1 | 9/2007 | Choi et al. |
| 2008/0169753 A1 | 7/2008 | Skipor et al. |
| 2008/0188063 A1 | 8/2008 | Alivisatos et al. |
| 2008/0277626 A1 | 11/2008 | Yang et al. |
| 2009/0053522 A1 | 2/2009 | Sekiguchi et al. |
| 2009/0134784 A1 | 5/2009 | Lin et al. |
| 2009/0314991 A1 | 12/2009 | Cho et al. |
| 2010/0264371 A1 | 10/2010 | Nick |
| 2010/0265307 A1 | 10/2010 | Linton et al. |
| 2015/0075397 A1 | 3/2015 | Gresty et al. |

(Continued)

FOREIGN PATENT DOCUMENTS

| | | |
|---|---|---|
| CN | 102017217 A | 4/2011 |
| CN | 102916097 A | 2/2013 |

(Continued)

OTHER PUBLICATIONS

English translation for JP 2008-076855, Apr. 2, 2008.*
Jing Huang et al. Surface Functionalization of Semiconductor and Oxide Nanocrystals with Small Inorganic Oxoanions (PO, MoO) and Polyoxometalate Ligands, ACS Nano 8.9 (2014): 9388-9402, 36 pages.
Feng Zhang et al. Brightly Luminescent and Color-Tunable Colloidal CH3NH3PbX3 (X=Br, I, Cl) Quantum Dots: Potential Alternatives for Display Technology, ACS Nano 9.4 (2015): 4533-4542, 10 pages.

(Continued)

Primary Examiner — C Melissa Koslow
(74) Attorney, Agent, or Firm — Anova Law Group, PLLC (57) ABSTRACT

Provided are a printing ink comprising inorganic nano-materials and an electronic device manufactured by printing with the printing ink, in particular, an electroluminescent device. The composition of the provided ink comprises at least one inorganic nano-material, in particular, quantum dots, and at least one ester-based organic solvent.

10 Claims, 1 Drawing Sheet (56) References Cited

U.S. PATENT DOCUMENTS

| | | | |
|---|---|---|---|
| 2015/0079720 | A1 | 3/2015 | Liu et al. |
| 2015/0101665 | A1 | 4/2015 | Liu et al. |
| 2015/0108405 | A1 | 4/2015 | Peng et al. |

FOREIGN PATENT DOCUMENTS

| | | | |
|---|---|---|---|
| CN | 101878535 B | | 3/2014 |
| CN | 105153811 A | | 12/2015 |
| JP | 2008-076855 | * | 4/2008 |
| KR | 20050121443 A | | 12/2005 |
| TW | 201340370 A | | 10/2013 |
| WO | 03097904 A1 | | 11/2003 |
| WO | 2006134599 A1 | | 12/2006 |
| WO | 2007092606 A2 | | 8/2007 |
| WO | 2007117672 A2 | | 10/2007 |
| WO | 2007117698 A2 | | 10/2007 |
| WO | 2007120877 A2 | | 10/2007 |
| WO | 2007137292 A2 | | 11/2007 |
| WO | 2007143197 A2 | | 12/2007 |
| WO | 2008013366 A1 | | 1/2008 |
| WO | 2008033388 A2 | | 3/2008 |
| WO | 2008063652 A1 | | 5/2008 |
| WO | 2008063653 A1 | | 5/2008 |
| WO | 2008070028 A2 | | 6/2008 |
| WO | 2008085210 A2 | | 7/2008 |
| WO | 2008105792 A2 | | 9/2008 |
| WO | 2008108798 A2 | | 9/2008 |
| WO | 2008111947 A1 | | 9/2008 |
| WO | WO 2008/111947 | * | 9/2008 |
| WO | 2010135519 A1 | | 11/2010 |

OTHER PUBLICATIONS

Miri Kazes et al. Lasing from Semiconductor Quantum Rods in a Cylindrical Microcavity, Advanced Materials 14.4 (2002): 317-321, 5 pages.

Younan Xia et al. One-Dimensional Nanostructures: Synthesis, Characterization, and Applications, Advanced Materials 15.5 (2003): 353-389, 37 pages.

Enhai Song et al. Anomalous NIR Luminescence in Mn 2+-Doped Fluoride Perovskite Nanocrystals, Advanced Optical Materials 2014, 2, 670-678, 9 pages.

T. K. Sau et al, Nonspherical Noble Metal Nanoparticles: Colloid-Chemical Synthesis and Morphology Control, Advanced Materials 22.16 (2010): 1781-1804, 24 pages.

Younan Xia et al. Shape-Controlled Synthesis of Metal Nanocrystals: Simple Chemistry Meets Complex Physics? Angewandte Chemie 48.1 (2009): 60-103, 44 pages.

Hui Zhang et al, Noble-Metal Nanocrystals with Concave Surfaces: Synthesis and Applications, Angewandte Reviews, 51.31 (2012): 7656-7673, 19 pages.

Sifei Zhuo et al. Self-Template-Directed Synthesis of Porous Perovskite Nanowires at Room Temperature for High-Performance Visible-Light Photodetectors, Angewandte Chemie 54.19 (2015): 5693-5696, 5 pages.

C.B. Murray et al. Synthesis and Characterization of Monodisperse Nanocrystals and Close-Packed Nanocrystal Assemblies, Annual Review of Materials Science 30.0 (2000): 545-610, 68 pages.

Nurxat Nuraje et al. Perovskite Ferroelectric Nanomaterials, Nanoscale 5.19 (2013): 8752-8780, 29 pages.

G. Gu et al. Transparent Organic Light Emitting Devices, Applied Physics Letters 68.19 (1996): 2606-2608, pages.

Joel Embden et al. The Heat-Pp Synthesis of Colloidal Nanocrystals, Chemistry of Materials 27.7 (2015): 2246-2285, 40 pages.

H. Kipphan et al. Handbook of Print Media: Technologies and Production Methods, Springer Science & Business Media, 2001. 13 pages.

Linhua Hu et al. The Role of Oleic Acid: From Synthesis to Assembly of Perovskite Nanocuboid Two-Dimensional Arrays, Inorganic Chemistry 54.3 (2015): 740-745, 6 pages.

L. Schmidt et al. Nontemplate Synthesis of CH3NH3PbBr3 Perovskite Nanoparticles, Journal of the American Chemical Society 136.3 (2014): 850-853, 4 pages.

A. Nag et al. Metal-free Inorganic Ligands for Colloidal Nanocrystals: S2-, HS-, Se2-, HSe-, Te2-, HTe-, TeS32-, OH-, and NH2- as Surface Ligands, Journal of the American Chemical Society 133.27 (2011): 10612-10620, 9 pages.

S. G-Carrero et al. Approaching the Top of the Emissive Properties of CH3NH3PbBr3 Perovskite Nanoparticles, Journal of Materials Chemistry A, 2015, 3, 9187-9193, 10 pages.

C.B. Murray et al. Synthesis and Characterization of Nearly Monodisperse CdE (E=S, Se, Te) Semiconductor Nanocrystallites, Journal of the American Chemical Society 115.19 (1993): 8706-8715, 10 pages.

M. Artemyev et al. Unidirectional Alignment of CdSe Nanorods, Nano Letters 3.4 (2003): 509-512, 4 pages.

E. Rothenberg et al. Electric Field Induced Switching of the Fluorescence of Single Semiconductor Quantum Rods, Nano Letters 5.8 (2005): 1581-1586, 6 pages.

L. Protesescu et al. Nanocrystals of Cesium Lead Halide Perovskites (CsPbX3, X=Cl, Br, and I): Novel Optoelectronic Materials Showing Bright Emission with Wide Color Gamut, Nano Letters 15.6 (2015): 3692-3696, 5 pages.

G. Li et al. Efficient Light-Emitting Diodes Based on Nanocrystalline Perovskite in a Dielectric Polymer Matrix, Nano Letters 15.4 (2015): 2640-2644, 5 pages.

Xiaogang Peng, An Essay on Synthetic Chemistry of Colloidal Nanocrystals, Nano Research 2.6 (2009): 425-447, 23 pages.

V. Bulovic et al. Transparent Light-Emitting Devices, Nature 380.6569 (1996): 29-29, 2 pages.

J. Lim et al. Perspective on Synthesis, Device Structures, and Printing Processes for Quantum Dot Displays, Optical Materials Express 2.5 (2012): 594-628, 35 pages.

S G-Carrero et al. Organometal Halide Perovskites: Bulk Low-Dimension Materials and Nanoparticles, Particle & Particle Systems Characterization 32.7 (2015): 709-720, 12 pages.

C. Muthu et al, Luminescent Hybrid Perovskite Nanoparticles as a New Platform for Selective Detection of 2,4,6-Trinitrophenol, RSC Advances 4.99 (2014): 55908-55911, 5 pages.

A. R. Tao et al. Shape Control of Colloidal Metal Nanocrystals, Small 4.3 (2008): 310-325, 16 pages.

Dawei Di et al. Size-Dependent Photon Emission from Organometal Halide Perovskite Nanocrystals Embedded in an Organic Matrix, Journal of Physical Chemistry Letters 6.3 (2015): 446-450, 17 pages.

* cited by examiner

PRINTING INK AND ELECTRONIC DEVICE

CROSS-REFERENCES TO RELATED APPLICATIONS

This application is a national stage application of PCT Patent Application No. PCT/CN2016088636, filed on Jul. 5, 2016, which claims priority to Chinese Patent Application No. 201510501235.3, filed on Aug. 14, 2015, the content of all of which is incorporated herein by reference.

FIELD OF THE INVENTION

The present invention relates to a printing ink comprising an inorganic nano-material, the printing ink comprises at least one inorganic nano-material, specifically, a quantum dot, and at least one ester-based organic solvent; the present invention further relates to an electronic device manufactured by printing with the printing ink, specifically, an electroluminescent device.

BACKGROUND

A quantum dot is a nano-sized semiconductor material with a quantum confinement effect. When stimulated by a light or electricity, the quantum dot will emit a fluorescence with a specific energy. A color (an energy) of the fluorescence is determined by a chemical composition, a size and a shape of the quantum dot. Therefore, a control of the size and shape of the quantum dot may effectively control a plurality of electrical and optical properties thereof. Currently, every country is studying an application of the quantum dots in a full-color area, mainly in a display area.

Recently, an electroluminescent device with the plurality of quantum dots working as a light-emitting layer (Quantum dot Light Emitting Diodes, QLED) has been rapidly developed, and a device lifetime thereof has been greatly improved, as published in Peng et al., Nature Vol 515 96 (2015) and Qian et al., Nature Photonics Vol 9259 2015). Under an electric field applied, the electroluminescent device injects an electron and an electron hole into a light-emitting layer respectively to recombine before emitting a light. A spin-coating technology is currently a main method used to form a quantum dot light-emitting layer film. However, the spin-coating technology is hard to apply to manufacturing a large-area electroluminescent device. In a contrast, an ink-jet printing may manufacture the quantum dot film in a large-area and a low-cost; compared to a traditional semiconductor manufacturing process, the ink-jet printing has a plurality of advantages including a low power consumption, a low water consumption, and environmental friendly, which is a production technology with a great advantage and potential. A viscosity and a surface tension are important parameters affecting a printing ink and a printing process thereof. A promising printing ink needs a proper viscosity and surface tension. At present, a plurality of companies has reported a plurality of quantum dot inks for printing:

Nanoco Technologies Ltd of British, has disclosed a method of manufacturing a printable ink comprising a plurality of nanoparticles (CN101878535B). A printable nanoparticle ink and a film containing the nanoparticles accordingly, were obtained by selecting a suitable ink substrate, such as a toluene and a dodecane selenol.

Samsung Electronics has disclosed a quantum-dots ink for ink-jet printing (U.S. Pat. No. 8,765,014B2). The ink contains a quantum-dots material in a certain concentration, an organic solvent, and a plurality of alcohol polymer additives with a high viscosity. By printing the ink, a quantum dots film is obtained, and a quantum-dot electroluminescent device is prepared.

QD Vision, Inc. has disclosed a quantum-dots ink formulation, the formulation comprises a host material, a quantum dot material and an additive (US2010264371A1).

A plurality of other patents related to the quantum-dots inks for printing are: US2008277626A1, US2015079720A1, US2015075397A1, TW201340370A, US2007225402A1, US2008169753A1, US2010265307A1, US2015101665A1, and WO2008105792A2. In these disclosed patents, to control a plurality of physical parameters of the ink, all these quantum-dots inks are containing other additives, such as an alcoholic polymer. However, introducing the additives of polymer with an insulating property may reduce a charge transportation capacity of the film, and have a negative impact on an optoelectronic property of the device, thus may limit a wide application thereof in an area of optoelectronic device. Therefore, finding an organic solvent system with an appropriate surface tension and viscosity for dispersing the quantum dots is particularly important.

BRIEF SUMMARY OF THE DISCLOSURE

According to the above described defects, the purpose of the present invention is providing a new printing ink comprising an inorganic nano-material, the printing ink comprises at least one inorganic nano-material, specifically, a quantum-dots material, and at least one ester-based organic solvent; the present invention further provides an electronic device manufactured by printing with the printing ink, specifically, an optoelectronic device, and more specifically, an electroluminescent device.

In order to achieve the above mentioned goals, the technical solution of the present invention to solve the technical problems is as follows:

A printing ink, comprising an inorganic nano-material and at least one ester-based organic solvent, wherein, the ester-based organic solvent has a boiling point ≥200° C., and a viscosity in a range of 1 cPs to 100 cPs at 25° C., preferably, in a range of 1 cPs to 50 cPs, more preferably, in a range of 1 cPs to 30 cPs, and most preferably, in a range of 1.5 cPs to 20 cPs, the ester-based organic solvent is able to be evaporated from a solvent system and form an inorganic nano-material film.

Wherein the ester-based organic solvent has a surface tension in a range of 19 dyne/cm to 50 dyne/cm at 25° C., preferably in a range of 20 dyne/cm to 40 dyne/cm, more preferably in a range of 22 dyne/cm to 35 dyne/cm, and most preferably, in a range of 25 dyne/cm to 33 dyne/cm.

Wherein the ester-based organic solvent has a structure shown as a general formula (I), (II) or (III):

(III)

Wherein, $R^1$ to $R^6$ may be identical or different, being a linear alkyl, alkoxy or thioalkoxy group having 1 to 20 Carbon atoms, or a branched or cyclic alkyl, alkoxy or thioalkoxy group or a silyl group having 3 to 20 Carbon atoms, or a substituted keto group having 1 to 20 Carbon atoms, an alkoxycarbonyl group having 2 to 20 Carbon atoms, an aryloxycarbonyl group having 7 to 20 of Carbon atoms, a cyano group (—CN), a carbamoyl group (—C(=O)NH2), a haloformyl group (—C(=O)—X, wherein X represents a halogen atom), a formyl group (—C(=O)—H), an isocyano group, an isocyanate group, a thiocyanate group or an isothiocyanate group, a hydroxyl group, a nitro group, a CF3 group, a Cl, a Br, an F, a cross-linkable group or a substituted or unsubstituted aromatic or heteroaromatic ring system having 5 to 40 ring atoms, or an aryloxy or a heteroaryloxy group having 5 to 40 ring atoms, or a combination thereof.

Wherein the inorganic nano-material is a quantum dot material, that is, a grain size thereof has a monodisperse size distribution and a shape thereof may be selected from a plurality of different nano-topographies including a spherical shape, a cubic shape, a rod shape or a branched structure.

Wherein the printing ink comprises at least one luminescent quantum dot material, a luminescence wavelength thereof is between 380 nm and 2500 nm.

Wherein the at least one inorganic nano-material is a binary or multiple semiconductor compound quantum dots or a mixture thereof, in a group IV, a group II-VI, a group II-V, a group III-V, a group a group IV-VI, a group a group II-IV-VI, a group II-IV-V of a Periodic Table.

Wherein the at least one inorganic nano-material is a luminescent perovskite nanoparticle material, a metal nanoparticle material, or a metal oxide nanoparticle material, or a mixture thereof.

Wherein, the printing ink further comprises at least one organic functional material, the organic functional material is selected from a hole injection material (HIM), a hole transport material (HTM), an electron transport material (ETM), an electron injection material (EIM), an electrons barrier material (EBM), a hole blocking material (HBM), a light emitter (Emitter), a host material (Host).

Wherein a weight ratio of the inorganic nano-material is from 0.3% to 70%, and a weight ratio of the ester-based organic solvent is from 30% to 99.7%.

Wherein the ester-based organic solvent is selected from an_octanoic acid alkyl ester, a sebacic acid alkyl ester, a stearate alkyl ester, a benzoate alkyl ester, a phenylacetate_alkyl ester, a cinnamate_alkyl ester, an oxalate alkyl ester, a maleate alkyl ester, a lactone alkyl ester, an oleate alkyl ester, or a mixture of at least two thereof.

Wherein the ester-based organic solvent is selected from or mainly selected from the octanoic acid alkyl ester, the sebacic acid alkyl ester or a mixture thereof.

Wherein the ester-based organic solvent further comprises at least one other ester, the at least one other ester comprises diallyl phthalate, isonoyl isononanoate, or a mixture thereof. A total weight of the other ester in the ester solvent is less than 50%.

An electronic device, comprises a functional layer, the functional layer is printed from the printing ink described above, wherein the ester-based organic solvent is able to be evaporated from the solvent system, to form a film of the inorganic nano-material.

Wherein the electronic device is able to be selected from a quantum dot light emitting diode (QLED), a quantum dot photovoltaic cell (QPV), a quantum dot light emitting electrochemical cell (QLEEC), a quantum dot field effect transistor (QFET), a quantum dot luminescent field effect transistor, a quantum dot laser, a quantum dot sensor and so on.

Benefits:

The present invention provides a printing ink comprising inorganic nanoparticles, the printing ink comprises at least one inorganic nano-material, specifically a quantum dot material, and at least one ester-based organic solvent. The printing ink provided by the present invention, may adjust the viscosity and the surface tension to a suitable range for facilitating printing, according to a particular printing method, specifically, an ink jet printing, and forming a film having a uniform surface. While the ester-based organic solvent may be effectively removed by a post-treatment, including a heat treatment or a vacuum treatment, it has assured a performance of the electronic device. The present invention thus has provided a printing ink for preparing a high-quality quantum dot film, and provided a technical solution for printing a quantum dot electronic or an optoelectronic device.

DETAILED DESCRIPTION

In order to make the purpose, technical solution and the advantages of the present invention clearer and more explicit, further detailed descriptions of the present invention are stated here, referencing to the attached drawings and some preferred embodiments of the present invention. It should be understood that the detailed embodiments of the invention described here are used to explain the present invention only, instead of limiting the present invention.

The present invention provides a printing ink, wherein comprising at least one inorganic nano-material and at least one ester-based organic solvent, wherein, the ester-based organic solvent has a boiling point ≥200° C., and a viscosity in a range of 1 cPs to 100 cPs at 25° C., the ester-based organic solvent is able to be evaporated from a solvent system and form an inorganic nano-material film.

In a preferred embodiment, the printing ink comprises a solvent system, the solvent system comprises at least one ester-based organic solvent as shown in a general formula of (I), (II), (Ill):

(I)

(II)

(III)

Wherein, $R^1$ to $R^6$ may be identical or different, being a linear alkyl, alkoxy or thioalkoxy group having 1 to 20 Carbon atoms, or a branched or cyclic alkyl, alkoxy or thioalkoxy group or a silyl group having 3 to 20 Carbon atoms, or a substituted keto group having 1 to 20 Carbon atoms, an alkoxycarbonyl group having 2 to 20 Carbon atoms, an aryloxycarbonyl group having 7 to 20 Carbon atom, a cyano group (—CN), a carbamoyl group (—C(=O)NH2), a haloformyl group (—C(=O)—X, wherein X represents a halogen atom), a formyl group (—C(=O)—H), an isocyano group, an isocyanate group, a thiocyanate group or an isothiocyanate group, a hydroxyl group, a nitro group, a CF3 group, a Cl, a Br, an F, a crosslinkable group or a substituted or unsubstituted aromatic or heteroaromatic ring system having 5 to 40 ring atoms, or an aryloxy or a heteroaryloxy group having 5 to 40 ring atoms, or a combination thereof.

In a more preferred embodiment, the printing ink comprises a solvent system, the solvent system comprises at least one ester-based organic solvent as shown in the general formula of (I), (II) or (III), wherein, R1 to R6 may be identical or different, being a linear alkyl, alkoxy or thioalkoxy group having 1 to 10 Carbon atoms, or a branched or cyclic alkyl, alkoxy or thioalkoxy group or a silyl group having 3 to 10 Carbon atoms, or a substituted keto group having 1 to 10 Carbon atoms, an alkoxycarbonyl group having 2 to 10 Carbon atoms, an aryloxycarbonyl group having 7 to 10 Carbon atoms, a cyano group (—CN), a carbamoyl group (—C(=O)NH2), a haloformyl group (—C(=O)—X, wherein X represents a halogen atom), a formyl group (—C(=O)—H), an isocyano group, an isocyanate group, a thiocyanate group or an isothiocyanate group, a hydroxyl group, a nitro group, a CF3 group, a Cl, a Br, an F, a crosslinkable group or a substituted or unsubstituted aromatic or heteroaromatic ring system having 5 to 20 ring atoms, or an aryloxy or a heteroaryloxy group having 5 to 20 ring atoms, or a combination thereof.

In a certain preferable embodiment, the ester-based organic solvent according to the general formula (I) or (II), wherein, the $R^1$ to $R^5$ are selected from a plurality of groups following:

In a certain preferred embodiment, the ester-based organic solvent according to the general formula (III) is an alkyl lactone, wherein, $R^6$ is a linear alkyl having 1 to 10 Carbon atoms or a branched alkyl having 3 to 10 Carbon atoms. Specifically, it may be, but not limited to, 1,4-valerolactone, δ-caprolactone, σ-caprylolactone, γ-decalactone and more.

In another preferred embodiment, the ester-based organic solvent has a boiling point ≥200° C., and a surface tension in a range of 19 dyne/cm to 50 dyne/cm at 25° C., preferably in a range of 20 dyne/cm to 40 dyne/cm, more preferably in a range of 22 dyne/cm to 35 dyne/cm, and most preferably, in a range of 25 dyne/cm to 33 dyne/cm. In some embodiments, the eater-based organic solvent has a boiling point over 250° C. In some other embodiments, the ester-based organic solvent has a boiling point over 275° C. or over 300° C. The ester-based organic solvent may be evaporated from the solvent system, and form a quantum dot (or inorganic nanoparticle) material film.

The ester-based solvent system is capable of effectively dispersing the quantum dot (or inorganic nanoparticle) material, acting as a new dispersion solvent to replace of a conventionally used solvent to dispersing quantum dots, such as a toluene, a xylene, a chloroform, a chlorobenzene, a dichlorobenzene, an n-heptane and more.

The printing ink may contain additionally one or more components such as a surface-active compound, a lubricant, a wetting agent, a dispersant, a hydrophobing agent, an adhesive and more, to adjust the viscosity or a film-forming property, to improve an adhesion, and more.

The printing ink may be deposited by a plurality of techniques to obtain the quantum dot film. A suitable printing or coating technique includes, but not limited to, an inkjet printing, a nozzle printing, a typography, a screen printing, a dip-coating, a spin-coating, a blade coating, a roller printing, a reverse-roll printing, an offset lithography printing, a flexography, a web printing, a spray coating, a brush coating or a pad printing, a slot-die coating and more. A preferred printing technique is gravure, a nozzle printing and an ink jet printing. For more information on the printing techniques and associated ink requirements thereof, such as a solvent and a concentration, a viscosity, etc., it may be referenced to *Handbook of Print Media: Technologies and Production Methods*, ISBN 3-540-67326-1, edited by Helmut Kipphan. In general, a different printing technology has a different character requirement for the ink used. For example, a printing ink suitable for the ink-jet printing needs to regulate a surface tension, a viscosity, and a wettability of the ink so that the ink may be squirted well through a nozzle at a printing temperature (such as a room temperature, 25° C.) instead of being dried out on the nozzle or blocking the nozzle, or form a continuous, smooth and defect-free film on a specific substrate.

Specifically, the ester-based organic solvent applied to dispersing the quantum dots needs to take a boiling point parameter thereof into consideration. In a preferred embodiment, the ester-based organic solvent has a boiling point ≥200° C. In a more preferred embodiment, the ester-based organic solvent has a boiling point ≥250° C. In a most preferred embodiment, the ester-based organic solvent has a boiling point ≥300° C.

Specifically, the ester-based organic solvent applied to dispersing the quantum dots needs to consider a surface tension parameter thereof when making a selection. In a preferred embodiment, the ester-based organic solvent has a surface tension in a range of 19 dyne/cm to 50 dyne/cm at 25° C.; in a more preferred embodiment, the ester-based organic solvent has a surface tension in a range of 22 dyne/cm to 35 dyne/cm at 25° C.; and in a most preferred embodiment, the ester-based organic solvent has a surface tension in a range of 25 dyne/cm to 33 dyne/cm at 25° C.

In a preferred embodiment, the ink according to the present invention has a surface tension in a range of 19 dyne/cm to 50 dyne/cm at 25° C.; more preferably, in a range of 22 dyne/cm to 35 dyne/cm at 25° C.; most preferably, in a range of 25 dyne/cm to 33 dyne/cm at 25° C.

Specifically, the ester-based organic solvent applied to dispersing the quantum dots needs to take a viscosity parameter thereof into account, when making a selection. The viscosity may be adjusted through different methods, such as through selecting a suitable organic solvent and selecting a concentration of the nano-material in the ink. The solvent system containing the ester-based organic solvent according to the present invention may facilitate a user to adjust the printing ink in a proper range according to the printing method applied. Generally, a weight ratio of the inorganic nano-material contained in the printing ink according to the present invention is in a range of 0.3%~70 wt %, preferably, in a range of 0.5%~50 wt %, more preferably, in a range of 0.5%~30 wt %, most preferably, in a range of 1%~10 wt %. In a preferred embodiment, the ink of the ester-based organic solvent has a viscosity lower than 100 cps according to the above composition ratio; in a more preferred embodiment, the ink of the ester-based organic solvent has a viscosity lower than 50 cPs according to the above composition ratio; in a most preferred embodiment, the ink with the ester based organic solvent has a viscosity in a range between 1.5 to 20 cPs according to the above composition ratio.

Inks obtained according to the ester-based solvent systems satisfying the above boiling points and surface tension parameters and viscosity parameters are capable of forming the quantum dot films with a uniform thickness and a compositional property.

Specifically, inks obtained according to the ester-based solvent systems satisfying the above boiling points and surface tension parameters and viscosity parameters have a surface tension parameter suitable to a specific substrate and a specific printing method. For example, for the ink-jet printing, in a preferred embodiment, the surface tension of the ink is in a range about 19 dyne/cm to 50 dyne/cm at 25° C.; in a more preferred embodiment, the surface tension of the ink is in a range about 22 dyne/cm to 35 dyne/cm at 25° C.; in a most preferred embodiment, the surface tension of the ink is in a range about 25 dyne/cm to 33 dyne/cm at 25° C.

In a specific embodiment, the ester-based solvent system may contain an ester solvent at least 90% of a total weight of the solvent. Furthermore, the ester-based solvent system contains at least 99% by weight of the ester solvent, or almost or totally composed by the ester solvent.

In a certain embodiment, sebacatealkyl ester, octanoatealkyl ester, and a mixture of these esters or a mixture with other esters are well adapted to the ester-based solvent system.

In a certain embodiment, the ester-based organic solvent contains diethyl sebacate.

In a certain embodiment, the ester-based organic solvent contains an octyl octanoate, or a diethyl octanoate, or a mixture thereof, consisting essentially or entirely thereof. In a preferred embodiment, a weight ratio between the octyl octanoate and the diethyl octanoate contained by the ester-based organic solvent is in a range of 40:60 to 60:40; In a more preferred embodiment, a weight ratio between the octyl octanoate and the diethyl octanoate contained by the ester-based organic solvent is in a range of 45:55 to 55:45; In a most preferred embodiment, a weight ratio between the octyl octanoate and the diethyl octanoate contained by the ester-based organic solvent is 50:50;

In a certain embodiment, the ester-based organic solvent contains a mixture comprised by one or more sebacate alkyl ester and/or octanoate alkyl ester and other esters, consisting essentially or entirely thereof. The other esters include but not limited to a diallyl phthalate, an isononyl isononanoate, or a mixture thereof.

A printing ink, wherein, the ester-based organic solvent contains at least one other ester, the ester-based organic solvent contains at least 50% by weight of sebacate alkyl ester and/or octanoate alkyl ester.

In a preferred embodiment, a weight ratio between the sebacate alkyl ester and/or octanoate alkyl ester and the other ester is in a range of 50:50 to 90:10; in a more preferred embodiment, a weight ratio between the sebacate alkyl ester and/or octanoate alkyl ester and the other esters is in a range of 60:40 to 80:20; in a most preferred embodiment, a weight ratio between the sebacate alkyl ester and/or octanoate alkyl ester and the other esters is in a range of 65:35 to 75:25.

In another embodiment, the printing ink further comprises another organic solvent. Examples on the organic solvent, include but not limited to: methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4-dioxane, acetone, methyl ethyl ketone, 1,2-dichloroethane, 3-phenoxytoluene, 1,1,1-trichloroethane, 1,1,2,2-tetrachloroethane, ethyl acetate, butyl acetate, dimethylformamide, dimethylacetamide, dimethylsulfoxide, tetrahydronaphthalene, decahydronaphthalene, indene, and/or a mixture thereof.

The printing ink, contains at least one inorganic nano-material.

In a certain embodiment, an average grain size of the inorganic nano-material is in a range about 1 to 1000 nm. In a certain preferred embodiment, the average grain size of the inorganic nano-material is in a range about 1 to 100 nm. In a certain more preferred embodiment, the average grain size of the inorganic nano-material is in a range about 1 to 20 nm, and most preferably, in a range of 1 to 10 nm.

The inorganic nano-material may be selected from a plurality of different shapes, including but not limited to a plurality of different forms including a sphere, a cube, a rod, a disk or a branched structure, and a mixture of various shaped particles.

In a preferred embodiment, the inorganic nano-material is a quantum dot material, having a very narrow and monodisperse size distribution, that is, a difference in dimension between the particles is very small. Preferably, the monodisperse quantum dots have a root mean square deviation (RMSD) in dimension less than 15% rms; more preferably, the monodisperse quantum dots have a RMSD in dimension less than 10% rms; and most preferably, the monodisperse quantum dots have a RMSD in dimension less than 5% rms.

In a preferred embodiment, the inorganic nano-material is a luminescent material.

In a certain preferred embodiment, the luminescent inorganic nano-material is a quantum dot luminescent material.

In general, a luminescent quantum dot may emit a light at a wavelength between 380 nm and 2500 nm. For example, it has been found that, an emission wavelength of a quantum dot having a CdS core lies in a range of about 400 nm to 560 nm; an emission wavelength of a quantum dot having a CdSe core lies in a range of about 490 nm to 620 nm; an emission wavelength of a quantum dot having a CdTe core lies in a range of about 620 nm to 680 nm; an emission wavelength of a quantum dot having an InGaP core lies in a range of about 600 nm to 700 nm; an emission wavelength of a quantum dot having a PbS core lies in a range of about 800 nm to 2500 nm; an emission wavelength of a quantum dot having a PbSe core lies in a range of about 1200 nm to 2500 nm; an emission wavelength of a quantum dot having a CuInGaS core lies in a range of about 600 nm to 680 nm; an emission wavelength of a quantum dot having a ZnCuInGaS core lies in a range of about 500 nm to 620 nm; an emission wavelength of a quantum dot having a CuInGaSe core lies in a range of about 700 nm to 1000 nm;

In a preferred embodiment, the quantum dot material comprises at least one capable of emitting a blue light having an peak luminous wavelength of 450 nm to 460 nm or a green light having an peak luminous wavelength of 520 nm to 540 nm, or a red light having an peak luminous wavelength of 615 nm to 630 nm, or a mixture thereof.

The quantum dots contained may be selected with a specific chemical composition, topography, and/or size, to achieve emitting the light in a desired wavelength under an electrical stimulation. A relationship between a luminescent property of a quantum dot and a chemical composition, topography and/or size thereof may be found in Annual Review of Material Science, 2000, 30, 545-610; Optical Materials Express, 2012, 2, 594-628; Nano Res., 2009, 2, 425-447. Entire contents of the patent documents listed above are hereby incorporated by reference.

A narrow grain size distribution of the quantum dots enables the quantum dots to have a narrower emission spectra (J. Am. Chem. Soc., 1993, 115, 8706; US20150108405). In addition, according to a different chemical composition and structure employed, a size of the quantum dots must be adjusted accordingly within the size range described above, to achieve the luminescence properties of a desired wavelength.

Preferably, the luminescent quantum dot is a semiconductor nanocrystal. In one embodiment, a size of the semiconductor nanocrystals is in a range of about 5 nm to about 15 nm. In addition, according to the different chemical composition and structure employed, the size of the quantum dots must be adjusted accordingly within the size range described above, to achieve the luminescence properties of a desired wavelength.

The semiconductor nanocrystal includes at least one semiconductor material, wherein the semiconductor material may be selected from a binary or multiple semiconductor compound or a mixture thereof, in a group IV, a group II-VI, a group II-V, a group III-V, a group III-VI, a group IV-VI, a group I-III-VI, a group II-IV-VI, a group II-IV-V of a Periodic Table. Specifically, an example of the semiconductor material includes, but are not limited to, a group IV semiconductor compound, composed by an element Si, Ge, C and a binary compound SiC, SiGe; a group II-VI semiconductor compound, consisting of a plurality of binary compounds including CdSe, CdTe, CdO, CdS, CdSe, ZnS, ZnSe, ZnTe, ZnO, HgO, HgS, HgSe, HgTe, a plurality of ternary compounds including CdSeS, CdSeTe, CdالسTe, CdZnS, CdZnSe, CdZnTe, CgHgS, CdHgSe, ZnSeS, ZnSeTe, ZnSTe, HgSeS, HgSeTe, HgSTe, HgZnS, HgSeSe, and a plurality of quaternary compounds including CgHgSeS, CdHgSeTe, CgHgSTe, CdZnSeS, CdZnSeTe, HgZnSeTe, HgZnSTe, CdZnSTe, HgZnSeS; a group III-V semiconductor compound, consisting of a plurality of binary compounds including AlN, AlP, AlAs, AlSb, GaN, GaP, GaAs, GaSb, InN, InP, InAs, InSb, a plurality of ternary compounds including AlNP, AlNAs, AlNSb, AlPAs, AlPSb, GaNP, GaNAs, GaNSb, GaPAs, GaPSb, InNP, InNAs, InNSb, InPAs, InPSb, a plurality of quaternary compounds including GaAlNAs, GaAlNSb, GaAlPAs, GaInNP, GaInNAs, GaInNSb, GaInPAs, GaInPSb, InAlNP, InAlNAs, InAlNSb, InAlPAs, InAlPSb, a group IV-VI semiconductor compound, consisting of a plurality of binary compounds including SnS, SnSe, SnTe, PbSe, PbS, PbTe, a plurality of ternary compounds including SnSeS, SnSeTe, SnSTe, SnPbS, SnPbSe, SnPbTe, PbSTe, PbSeS, PbSeTe, and a plurality of quaternary compounds including SnPbSSe, SnPbSeTe, SnPbSTe.

In a preferred embodiment, the luminescent quantum dots comprise group II-VI semiconductor materials, preferably selected from CdSe, CdS, CdTe, ZnO, ZnSe, ZnS, ZnTe, HgS, HgSe, HgTe, CdZnSe, and any combinations thereof. In a proper embodiment, since a synthesis of CdSe is relatively mature, the material is thus used as a luminescent quantum dot for a visible light.

In another preferred embodiment, the luminescent quantum dots comprise group III-V semiconductor materials, preferably selected from InAs,InP,InN,GaN,InSb,InAsP,InGaAs,GaAs,GaP,GaSb,AlP,AlN,AlAs,AlSb,CdSeTe, ZnCdSe and any combinations thereof.

In another preferred embodiment, the luminescent quantum dots comprise a group IV-VI semiconductor material, preferably selected from PbSe, PbTe, PbS, PbSnTe, Tl2SnTe5, and any combinations thereof.

In a preferred embodiment, the quantum dot is a core-shell structure. Each of both the core and the shell comprises one or more semiconductor materials, either identical or different, respectively.

The core of the quantum dots may be selected from a binary or multiple semiconductor compound in the above group IV, group II-VI, group II-V, group III-V, group III-VI, group IV-VI, group I-III-VI, group II-IV-VI, group II-IV-V of a Periodic Table. Specifically, an embodiment on the core of the quantum dots includes but not limited to ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InSb, AlAs, AlN, AlP, AlSb, PbO, PbS, PbSe, PbTe, Ge, Si, or an alloy or a mixture of any combinations thereof.

The shell of the quantum dots may be selected from a plurality of semiconductor materials with identical or different cores. The semiconductor materials may be used for the shell include a binary or multiple semiconductor compound in the group IV, group II-VI, group II-V, group III-V, group III-VI, group IV-VI, group I-III-VI, group II-IV-VI, group II-IV-V of the Periodic Table. Specifically, an embodiment on the shell of the quantum dots includes but not limited to ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InSb, AlAs, AlN, AlP, AlSb, PbO, PbS, PbSe, PbTe, Ge, Si, or an alloy or a mixture of any combinations thereof.

The quantum dot with the core-shell structure, wherein, the shell may include a single-layer or multi-layer structure. The shell includes one or more semiconductor materials that are identical or different from the core. In a preferred embodiment, the shell has a thickness of about 1 to 20 layers. In a more preferred embodiment, the shell has a thickness of about 5 to 10 layers. In a certain embodiments, two or more shells are grown on a surface of the core of the quantum dot.

In a preferred embodiment, the semiconductor material used for the shell has a larger bandgap than the core. Specifically, the core-shell has a I-type semiconductor heterojunction structure.

In another preferred embodiment, the semiconductor material used for the shell has a smaller bandgap than the core.

In a preferred embodiment, the semiconductor material used for the shell has an atomic crystal structure that is the same as or close to the core. Such a choice helps to reduce a stress between the core and the shell, while making the quantum dots more stable.

In a preferred embodiment, the quantum dots with the core-shell structure adopted are, but not limited to:

Red light: CdSe/CdS,CdSe/CdS/ZnS,CdSe/CdZnS and ect.

Green light: CdZnSe/CdZnS,CdSe/ZnS and ect.

Blue light: CdS/CdZnS,CdZnS/ZnS and more.

A preferred method for preparing the quantum dots is a colloidal growth method. In a preferred embodiment, a method for preparing a monodisperse quantum dot is selected from a hot-inject method and/or a heating-up method. The method for preparation is disclosed in a document in Nano Res, 2009, 2, 425-447; Chem. Mater., 2015, 27 (7), pp 2246-2285. The entire contents of the documents listed above are hereby incorporated by reference.

In a preferred embodiment, a surface of the quantum dot contains a plurality of organic ligands. An organic ligand may control a growth of the quantum dots, control an appearance of the quantum dots and reduce a surface defect of the quantum dots, so as to improve a luminous efficiency and stability of the quantum dots. The organic ligand may be selected from a pyridine, a pyrimidine, a furan, an amine, an alkylphosphine, an alkylphosphine oxide, an alkylphosphonic acid or an alkylphosphinic acid, an alkylthiol and more. Examples of specific organic ligands include, but are not limited to, tri-n-octylphosphine, tri-n-octylphosphine oxide, trihydroxypropylphosphine, tributylphosphine, tridodecylphosphine, Tributyl phosphite, octadecyl phosphite, tridodecyl phosphite, didodecyl phosphite, triisodecyl phosphite, bis (2-ethylhexyl) phosphate, tridecyl phosphate, hexadecylamine, oleylamine, octadecylamine, dioctadecylamine, octacosamine, bis (2-ethylhexyl) amine, octylamine, dioctylamine, Amine, dodecylamine, didodecylamine, didodecylamine, hexadecylamine, phenyl phosphate, hexyl phosphate, tetradecyl phosphate, octyl phosphate, n-octadecyl phosphate, propylene diphosphate, dioctyl ether, Diphenyl ether, octyl mercaptan, dodecyl mercaptan.

In another preferred embodiment, the surface of the quantum dot contains a plurality of inorganic ligands. The quantum dots protected by the inorganic ligands may be obtained by ligands exchange of organic ligands on the surface of quantum dots. Specifically, an embodiment on inorganic ligands includes but not limited to: S2-, HS—, Se2-, HSe—, Te2-, HTe—, TeS 32-, OH—, NH 2-, PO 43-, MoO 42-, and more. An example on such an inorganic ligand quantum dot may refer to a document of J. Am. Chem. Soc. 2011, 133, 10612-10620; ACS Nano, 2014, 9, 9388-9402. All contents of the documents listed above are hereby incorporated for reference.

In certain embodiments, the surface of the quantum dots has one or more identical or different ligands.

In a preferred embodiment, a luminescence spectrum exhibited by the monodisperse quantum dot has a symmetrical peak shape and a narrow peak width at half height. Generally, the better a monodispersity of the quantum dots is, the more symmetrical a luminescence peak is, and the narrower the peak width at half height is. Preferably, the peak width at half height of the quantum dot is less than 70 nm; more preferably, the peak width at half height of the quantum dot is less than 40 nm; and most preferably, the peak width at half height of the quantum dot is less than 30 nm.

The quantum dots have a luminous quantum efficiency of 10%~100%. Preferably, the quantum dots have a luminous quantum efficiency of more than 50%; more preferably, the quantum dots have a luminous quantum efficiency of more than 80%; most preferably, the quantum dots have a luminous quantum efficiency of more than 90%.

A plurality of other materials, techniques, methods, applications, and other information concerning quantum dots that may be useful in the present invention are described in a plurality of patent documents following: WO2007/117698, WO2007/120877, WO2008/108798, WO2008/105792, WO2008/111947, WO2007/092606, WO2007/117672, WO2008/033388, WO2008/085210, WO2008/13366, WO2008/063652, WO2008/063653, WO2007/143197, WO2008/070028, WO2008/063653, U.S. Pat. No. 6,207,229, U.S. Pat. No. 6,251,303, U.S. Pat. No. 6,319,426, U.S. Pat. No. 6,426,513, U.S. Pat. No. 6,576,291, U.S. Pat. No. 6,607,829, U.S. Pat. No. 6,861,155, U.S. Pat. No. 6,921,496, U.S. Pat. No. 7,060,243, U.S. Pat. No. 7,125,605, U.S. Pat. No. 7,138,098, U.S. Pat. No. 7,150,910, U.S. Pat. No. 7,470,379, U.S. Pat. No. 7,566,476, WO2006134599A1. All contents of the documents listed above are hereby incorporated for reference.

In another preferred embodiment, a luminescent semiconductor nanocrystal is a nanorod. A characteristics of the nanorods is different from a spherical nanocrystal. For example, the luminescence of a nanorod is polarized along a long rod axis while the luminescence of a spherical crystal is unpolarized (refer to Woggon et al., Nano Lett., 2003, 3, p 509). The nanorod has an excellent characteristic on an optical gain that makes them potentially useful as a laser gain material (refer to Banin et al., Adv. Mater. 2002, 14, p 317). Additionally, the luminescence of the nanorod may be switched on and off reversibly under a control of an external electric field (refer to Banin et al., Nano Lett. 2005, 5, p 1581). A plurality of these characteristics of the nanorods may be preferentially incorporated into a device of the present invention, in some cases. An example of preparing a semiconductor nanorod includes: WO03097904A1, US2008188063A1, US2009053522A1, KR20050121443A. All contents of the documents listed above are hereby incorporated for reference.

In other preferred embodiments, the printing ink according to the present invention, wherein, the luminescent inorganic nano-material is a luminescent nanoparticle material of perovskite.

The nanoparticle material of perovskite has a general formula of $AMX_3$, wherein A includes an organic amine or an alkali metal cation, M includes a metal cation, X includes an oxoanion or a halogen anion. A specific embodiment includes but not limited to: $CsPbCl_3$, $CsPb(Cl/Br)_3$, $CsPbBr_3$, $CsPb(I/Br)_3$, $CsPbI_3$, $CH_3NH_3PbCl_3$, $CH_3NH_3Pb(Cl/Br)_3$, $CH_3NH_3PbBr_3$, $CH_3NH_3Pb(I/Br)_3$, $CH_3NH_3PbI_3$, and more. A plurality of examples on the nanoparticle material of perovskite may be referred to: Nano Lett., 2015, 15, 3692-3696; ACS Nano, 2015, 9, 4533-4542; AngewandteChemie, 2015, 127(19):5785-5788, Nano Lett., 2015, 15(4), pp 2640-2644, Adv. Optical Mater. 2014, 2, 670-678; The Journal of Physical Chemistry Letters, 2015, 6(3):446-450; J. Mater. Chem. A, 2015, 3, 9187-9193; Inorg. Chem. 2015, 54, 740-745, RSCAdv., 2014, 4, 55908-55911, J. Am. Chem. Soc., 2014, 136(3), pp 850-853, Part.Part..Syst.Charact.2015, doi:10.1002/ppsc.201400214, Nanoscale, 2013, 5(19):8752-8780. All contents of the documents listed above are hereby incorporated for reference.

In another preferred embodiment, the printing ink according to the present invention, wherein, the luminescent inorganic nano-material is a metal nanoparticle material.

The metal nanoparticle material includes but not limited to: nanoparticles of Cr, Mo, W, Ru, Rh, Ni, Ag, Cu, Zn, Pd, Au, Os, Re, Ir and Pt. A species, a morphology and a synthesis method of the metal nanoparticle material commonly seen may refer to Angew. Chem. Int. Ed. 2009, 48, 60-103; Angew. Chem. Int. Ed. 2012, 51, 7656-7673; Adv. Mater. 2003, 15, No. 5, 353-389, Adv. Mater. 2010, 22, 1781-1804; Small. 2008, 3, 310-325; Angew. Chem. Int. Ed. 2008, 47, 2-46, and more, as well as all references thereof. All contents of the documents listed above are hereby incorporated for reference.

In another preferred embodiment, the inorganic nano-material has a property of charge transport.

In a preferred embodiment, the inorganic nano-material has a capability of an electron transport. Preferably, such kind of inorganic nano-materials are selected from an n-type semiconductor material. An example of an n-type inorganic semiconductor material includes, but not limited to, a metal chalcogenide, a metal pnictide, or an elemental semiconductor, such as a metal oxide, a metal sulfide, a metal selenide, a metal telluride, a metal nitride, a metal phosphide, or a metal arsenide. Preferably, the n-type inorganic semiconductor material may be selected from: ZnO, ZnS, ZnSe, $TiO_2$, ZnTe, GaN, GaP, AlN, CdSe, CdS, CdTe, CdZnSe, and any combinations thereof.

In certain embodiments, the inorganic nano-material has a hole transport capability. Preferably, such kind of inorganic nano-materials are selected from a p-type semiconductor material. An inorganic p-type semiconductor material may be selected from: $NiO_x$, $WO_x$, $MoO_x$, $RuO_x$, $VO_x$, and any combinations thereof.

In a certain embodiment, the printing ink according to the present invention comprises at least two or more kinds of inorganic nano-materials.

In a certain embodiment, the printing ink according to the present invention further comprises at least one organic functional material. As described above, an object of the present invention is preparing an electronic device from a solution, due to a solubility in an organic solution and an inherent flexibility thereof, an organic material may be incorporated into a functional layer of an electronic device in certain cases, and bringing a plurality of other benefits, such as enhancing a flexibility of the device, improving a performance of film-making and so on. Asa principle, all organic functional materials applied for OLEDs, include but not limited to, hole injection material (HIM), hole transport material (HTM), electron transport material (ETM), electron injection material (EIM), electron blocking material (EBM), hole blocking material (HBM), light emitter (Emitter) and host material (Host) may all be applied in the printing ink of the present invention. Various organic functional materials are described in detail, for example, in WO2010135519A1 and US20090134784A1. All contents of the documents listed above are hereby incorporated for reference.

The present invention further relates to an electron device, containing one or a plurality of functional films, wherein at least one layer of the film is prepared by the printing ink according to the present invention, specifically, through a method of printing or coating.

The film containing nanoparticles according to the present invention is prepared through a method of printing or coating. In a preferred embodiment, the film containing nanoparticles is prepared through a method of ink jet printing. An ink jet printer applied to printing the ink containing the quantum dots according to the present invention may be a printer already commercially available, which contains drop-on-demand print heads. Such a printer may be bought from Fujifilm Dimatix (Lebanon, N.H.), Trident International (Brookfield, Conn.), Epson (Torrance, Calif.), Hitachi Data systems Corporation (Santa Clara, Calif.), Xaar PLC (Cambridge, United Kingdom), and Idanit Technologies, Limited (Rishon Le Zion, Isreal). For example, the present invention may be printed by Dimatix materials Printer DMP-3000 (Fujifilm).

A suitable electronic device includes but not limited to: a quantum dot light emitting diode (QLED), a quantum dot photovoltaic cell (QPV), a quantum dot light emitting electrochemical cell (QLEEC), a quantum dot field effect transistor (QFET), a luminescent field effect transistor, a quantum dot laser, a quantum dot sensor and more.

Figure 1:
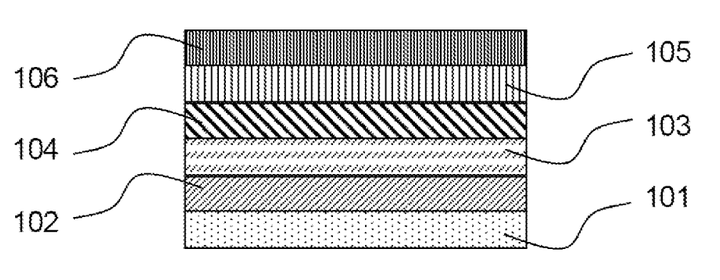
FIG. 1 illustrates a specifically preferable light-emitting device according to the present prevention, wherein, 101 is a substrate, 102 is an anode, 103 is a hole injection layer (HIL) or a hole transport layer (HTL), 104 is a light-emitting layer, 105 is an electron injection layer (EIL) or an election transport layer (ETL), 106 is a cathode.

In a preferred embodiment, the electronic device listed above is an electroluminescent device, as shown in FIG. 1, the electroluminescent device comprises a substrate (101), an anode (102), at least a light emitting layer (104), a cathode (106). The substrate (101) may be opaque or transparent. A transparent substrate can be applied to making a transparent light-emitting component. Refer to, for example, Bulovic et al. Nature 1996, 380, p 29, and Gu et al., Appl. Phys. Lett. 1996, 68, p 2606. A substrate may be rigid or elastic. The substrate may be a plastic, a metal, a semiconductor wafer or a glass. Preferably, the substrate has a smooth surface. A substrate without any surface defects is a particularly desirable choice. In a preferred embodiment, the substrate is selected from a polymer film or a plastic, which has a glass transition temperature Tg of 150° C. or higher, preferably over 200° C., more preferably over 250° C. and most preferably over 300° C. An example of the suitable substrate is a poly (ethylene terephthalate) (PET) or a polyethylene glycol (2,6-naphthalene) (PEN).

The anode (102) may comprise a conductive metal or a metal oxide, or a conductive polymer. The anode may easily inject an electron hole into the HIL or HTL or the light-emitting layer. In an embodiment, an absolute value of the difference between a work function of the anode and an HOMO level or a valence band level of the p-type semiconductor material working as HIL or HTL is less than 0.5 eV, preferably less than 0.3 eV, and most preferably, less than 0.2 eV. An example of an anode material includes, but not limited to, Al, Cu, Au, Ag, Mg, Fe, Co, Ni, Mn, Pd, Pt, ITO, aluminum-doped zinc oxide (AZO) and more. Other suitable anode materials are known and may be readily selected by an ordinary skilled man in the art. The anode material may be deposited using any suitable techniques, such as a suitable physical vapor deposition method, including a radio frequency magnetron sputtering deposition, a vacuum thermal evaporation deposition, an e-beam deposition, and more.

In certain embodiments, the anode is pattern-structured. A patterned ITO conductive substrate is commercially available and may be applied to making devices according to the present invention.

The cathode (106) may comprise a conductive metal or a metal oxide. The cathode may easily inject an electron into the EIL or ETL or directly to the light-emitting layer. In an embodiment, an absolute value of the difference between a work function of the cathode and a LUMO level or conduction band level of an-type semiconductor material working as EIL or ETL or HBL is less than 0.5 eV, preferably less than 0.3 eV, and most preferably, less than 0.2 eV. Principally, all materials being able to be applied to a cathode of an OLED may be applied to the device according to the present invention. An example of a cathode material includes, but not limited to, Al,Au,Ag,Ca,Ba,Mg,LiF/Al,Mg or Ag alloy, BaF2/Al, Cu,Fe,Co,Ni,Mn,Pd,Pt, ITO and more. A cathode material may be deposited using any suitable techniques, such as a suitable physical vapor deposition method, including a radio frequency magnetron sputtering deposition, a vacuum thermal evaporation deposition, an e-beam deposition, and more.

The light emitting layer (104) contains at least one luminescent nano-material, with a thickness between 2 nm and 200 nm. In a preferred embodiment, a light-emitting device according to the present invention, wherein, the light-emitting layer thereof is prepared by printing the printing ink according to the present invention, while the printing ink contains a luminescent nano-material as described above, specifically a quantum dot.

In a preferred embodiment, the light-emitting device according to the present invention further comprises a hole injection layer (HIL) or a hole transport layer (HTL) (103), wherein comprising the organic HTM or an inorganic p-type material. AHIL or HTL may be prepared by printing the printing ink according to the present invention, wherein the printing ink contains an inorganic nano-material having a hole-transport ability, specifically a quantum dot.

In another preferred embodiment, the light-emitting device according to the present invention further comprises an electron injection layer (EIL) or an electron transport layer (ETL) (105), wherein comprising the organic ETM described above or an inorganic n-type material. An EIL or ETL may be prepared by printing the printing ink according to the present invention, wherein the printing ink contains an inorganic nano-material having an electron-transport ability, specifically a quantum dot.

The present invention further relates to an application of the light-emitting device according to the present invention in various cases including but not limited to, a plurality of various display devices, a plurality of backlight, a plurality of illuminating light sources and more.

The present invention will be described below with reference to a plurality of preferred embodiments, however, the present invention is not limited to the following embodiments. It should be understood that a plurality of claims appended have summarized a scope of the present invention, and under a guidance of the concept of the present invention, a technical personnel in the art should recognize that, a certain changes to the disclosed embodiments are intended to be encompassed within the scope of the claims of the present disclosure.

EMBODIMENTS

Embodiment 1: Preparing a Blue Light Quantum Dot (CdZnS/ZnS)

Weigh 0.0512 g S and an amount of 2.4 mLODE before putting in to a 25 mL one-necked flask, then place the flask into an oil pan before heated to 80° C. to dissolve the S, standby, hereinafter it is referred to solution 1; Weigh 0.1280 g S and an amount of 5 mLOA before putting into a 25 mL one-necked flask, and then place the flask into an oil pan before heated to 90° C. to dissolve the S, standby, hereinafter it is referred to solution 2; Weigh 0.1028 gCdO and 1.4680 g zinc acetate, and an amount of 5.6 mL OA, before putting into a 50 mL three-necked flask, then place the three-necked flask in a 150 mL heating mantle, while plugging both necks with two rubber plugs, and a condenser is connected above, the flask is then connected to a double-tube, before heated to 150° C., and evacuated for 40 minutes, and then purged with nitrogen. Using a syringe to add 12 mL ODE into the three-necked flask, before heated to 310° C., followed by injecting rapidly 1.92 mL solution 1 by a syringe into the three-necked flask, count for 12 min, add 4 mL of the solution 2 by drops into the three-necked flask with a syringe right after the 12 min, with a dropping rate about 0.5 mL/min, wait for a reaction lasting 3 h, before stopping the reaction, and put the three-necked flask immediately in water to cool down to 150° C.;

Add an excess n-hexane into the three-necked flask, then transfer a liquid in the three-necked flask to a plurality of centrifuge tubes of 10 mL, centrifuge and remove a lower sediment, repeat for three times; add acetone to the liquid after the treatment to produce a precipitate, centrifuge and remove a supernatant, with the precipitate leaving; followed by using an n-hexane to dissolve the precipitate, and adding acetone for precipitating, centrifuge and remove a supernatant, with a precipitate leaving, repeat for three times; finally, dissolve the precipitate with a toluene before transferring to a glass bottle for storage.

Embodiment 2: Preparing a Green Light Quantum Dot (CdZnSeS/ZnS)

Weigh 0.0079 g Se and 0.1122 g S before putting into a 25 mL one-necked flask, and an amount of 2 mL TOP, purged with nitrogen, stir and standby, thereafter it is referred to solution 1; weight 0.0128 g CdO and 0.3670 g Zinc acetate, and an amount of 2.5 mL OA before putting into a 25 mL three-necked flask, while plugging both necks with two rubber plugs, and a condenser is connected above, the flask is then connected to a double-tube, followed by placing the three-necked flask into a 50 mL heating mantle, evacuated and purged with nitrogen, before heated to 150° C., and evacuated for 30 min, injected with 7.5 mL ODE, and heated to 300° C., followed by injecting rapidly 1 mL solution 1, count for 10 min; stop the reaction right after 10 min, and place the three-necked flask into water for cooling.

Add 5 mL n-hexane into the three-necked flask, then transfer the mixture in the three-necked flask into a plurality of centrifuge tubes of 10 mL, add acetone to produce a precipitate, and centrifuge. Take the precipitate and remove a supernatant, dissolve the precipitate with n-hexane, add the acetone to produce a precipitate, then centrifuge. Repeat for three times. And, at last, the participate is dissolved with a small amount of toluene, before transferring to a glass bottle for storage.

Embodiment 3: Preparing a Red Light Quantum Dot (CdSe/CdS/ZnS)

Add 1 mmol CdO, 4 mmol OA and 20 mL ODE into a 100 mL three-necked flask, purge with nitrogen, heat to 300° C. and a precursor of Cd(OA)2 is formed. At such a temperature, inject rapidly 0.25 mL TOP with 0.25 mmol Se powder dissolved. React for 90 seconds at such a temperature, a reaction solution grows for a about 3.5 nm CdSe core. Add 0.75 mmol octylmercaptan into the reaction solution by drops at a temperature of 300° C., react for 30 min and a CdS shell with about 1 nm thickness is grown. Followed by adding 4 mmol Zn(OA)2 and 2 ml TBP with 4 mmol S powder dissolved into the reaction solution by drops, to grow a ZnS shell (about 1 nm). The reaction lasts for 10 minutes before cooling to a room temperature.

Add 5 mL n-hexane into the three-necked flask, then transfer a mixture in the three-necked flask into a plurality of centrifuge tubes of 10 mL, add acetone to produce a precipitate, and centrifuge. Take the precipitate and remove a supernatant, dissolve the precipitate with n-hexane, add the acetone to produce a precipitate, then centrifuge. Repeat for three times. And, at last, the participate is dissolved with a small amount of toluene, before transferring to a glass bottle for storage.

Embodiment 4: Preparing a ZnO Nanoparticle

Dissolve 1.475 g zinc acetate in 62.5 mL methanol, and obtain a solution 1. Dissolve 0.74 g KOH in 32.5 mL methanol, and obtain a solution 2. Heat the solution 1 up to 60° C. and stir vigorously. Add the solution 2 by drops into the solution 1 using a sampler. After completed, the mixture is kept stirring for 2 hours at 60° C. Remove the heat source and leave the solution system undisturbed for 2 hours. Under a centrifugation condition of 4500 rpm, 5 min, wash the reaction solution by centrifugation three times or more. And a white solid finally obtained is the ZnO nanoparticle with a diameter of about 3 nm.

Embodiment 5: Preparing a Printing Ink with the Quantum Dots Containing the Octyl Octanoate In the present invention, ester-contained solvents including octyl octanoate, diethyl sebacate, diallyl phthalate and isononyl isononanoate are used, a boiling point and a rheological parameter thereof are shown in Table 1 below.

|  | Boiling point (° C.) | Surface tension@RT (dyne/cm) | Viscosity@RT (cPs) |
|---|---|---|---|
| octyl octanoate | 307 | 30.1 | 4.56 |
| diethyl sebacate | 312 | 32.9 | 6 |
| diallyl phthalate | 290 | 39.2 | 9~13 |
| isononyl isononanoate | 285 | 27.8 | 7 |

Put a stirrer into a vial, clean it up before transferring to a glove box. In the vial, prepare 9.5 g octyl octanoate. Seperate out the quantum dots from the solution with acetone, centrifuge and obtain a solid of quantum dots. Weigh 0.5 g the solid of the quantum dots from the glove box, add to the solvent system in the vial, stir and mix. Keep stirring at a temperature of 60° C. until the quantum dots are fully dispersed, cool to the room temperature. Membrane Filtrate the quantum dot solution obtained through a 0.2 μm PTFE filter. Seal and store.

Embodiment 6: Preparing the Printing Ink with the Quantum Dots Containing the Diethyl Sebacate Put a stirrer into a vial, clean it up before transferring to a glove box. In the vial, prepare 9.5 g diethyl sebacate. Separate out the quantum dots from the solution with acetone, centrifuge and obtain a solid of quantum dots. Weigh 0.5 g the solid of the quantum dots from_the glove box, add to the solvent system in the vial, stir and mix. Keep stirring at a temperature of 60° C. until the quantum dots are fully dispersed, cool to the room temperature. Membrane Filtrate the quantum dot solution obtained through a 0.2 μm PTFE filter. Seal and store.

Embodiment 7: Preparing the Printing Ink with the Quantum Dots Containing the Octyl Octanoate and the Diethyl Sebacate Put a stirrer into a vial, clean it up before transferring to a glove box. In the vial, prepare 9.5 g the octyl octanoate and the diethyl sebacate with a weight ratio of 1:1. Separate out the quantum dots from the solution with acetone, centrifuge and obtain a solid of quantum dots. Weigh 0.5 g the solid of the quantum dots from the glove box, add to the solvent system in the vial, stir and mix. Keep stirring at a temperature of 60° C. until the quantum dots are fully dispersed, cool to the room temperature. Membrane Filtrate the quantum dot solution obtained through a 0.2 μm PTFE filter. Seal and store.

Embodiment 8: Preparing the Printing Ink with the Quantum Dots Containing a Plurality of Mixed Solvents Put a stirrer into a vial, clean it up before transferring to a glove box. In the vial, prepare 9.5 g the octyl octanoate, diallyl phthalate, isononyl isononanoate with a weight ratio of 5.5:3:1.5. Separate out the quantum dots from the solution with acetone, centrifuge and obtain a solid of quantum dots. Weigh for 0.5 g of the solid of the quantum dots from the glove box, add to the solvent system in the vial, stir and mix. Keep stirring at a temperature of 60° C. until the quantum dots are fully dispersed, cool to the room temperature.

Membrane Filtrate the quantum dot solution obtained through a 0.2 μm PTFE filter. Seal and store.

Embodiment 9: A Test of the Viscosity and the Surface Tension

The viscosity of the printing ink with the quantum dots was measured by a DV-IPrime Brookfield rheometer; the surface tension of the printing ink with the quantum dots was measured by a SITA bubble pressure tensiometer.

From the test described above, the viscosity of the printing ink with the quantum dots obtained in the example 5 is 4.6±0.3 cPs, the surface tension is 29.4±0.1 dyne/cm.

From the test described above, the viscosity of the printing ink with the quantum dots obtained in the example 6 is 6.2±0.3 cPs, the surface tension is 31.7±0.1 dyne/cm.

From the test described above, the viscosity of the printing ink with the quantum dots obtained in the example 7 is 5.2±0.3 cPs, the surface tension is 29.3±0.1 dyne/cm.

From the test described above, the viscosity of the printing ink with the quantum dots obtained in the example 8 is 5.6±0.3 cPs, the surface tension is 29.2±0.2 dyne/cm.

Using the above-prepared printing ink containing quantum dots based on the ester solvent system, through a method of ink-jet printing, the functional layers in the quantum dot light-emitting diode may be prepared, including the light-emitting layer and the charge transport layer, the specific steps are as follows.

Put the ink containing the quantum dots into an ink tank, and mount the ink tank onto an ink jet printer such as a Dimatix Materials Printer DMP-3000 (Fujifilm). Adjust a waveform, a pulse time and a voltage of jetting the ink, before achieving a best of the ink-jetting, and a stability of the ink-jetting range. When preparing a QLED device with a quantum dot film as a light-emitting layer, the following technical solution is adopted: The substrate of the QLED is 0.7 mm-thick glass sputtered with an indium tin oxide (ITO) electrode pattern. On the ITO, a pixel definition layer is patterned to form a plurality of holes for depositing the printing ink inside. Followed by obtaining a HIL/HTL film through ink-jet printing the HIL/HTL material into the holes and removing the solvent by drying under a high temperature in a vacuum environment. Followed by ink-jet printing the printing ink containing the light emitting quantum dots onto the HIL/HTL film, and removing the solvent by high-temperature drying in a vacuum environment to obtain a quantum dots light-emitting layer film. Followed by ink-jet printing the printing ink containing the quantum dots and the electron transport property onto the light-emitting layer film, and removing the solvent by high-temperature drying in a vacuum environment, to form an electron transport layer (ETL). When using the organic electronic transport materials, the ETL may also be formed by vacuum thermal evaporation. Then, an Al cathode is formed by vacuum thermal evaporation, and finally the QLED device preparation is completed and packaged.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. A printing ink, comprising: an inorganic nano-material and at least one ester-based organic solvent; wherein:

the inorganic nano-material comprises at least one luminescent quantum dot material, the at least one luminescent quantum dot material having a monodisperse size distribution and at least one shape selected from the group consisting of: a spherical shape, a cubic shape, a rod shape, and a branched structure; and the ester-based organic solvent has a boiling point ≥200° C., and a viscosity in a range of 1 cPs to 100 cPs at 25° C., the ester-based organic solvent is able to be evaporated from a solvent system and form an inorganic nano-material film.

2. The printing ink according to claim 1, wherein the ester-based organic solvent has a surface tension in a range of 19 dyne/cm to 50 dyne/cm at 25° C.

3. The printing ink according to claim 1, wherein the ester-based organic solvent has a structure shown as a general formula (I), (II) or (III):

wherein, $R^1$ to $R^6$ may be identical or different, being a linear alkyl, alkoxy or thioalkoxy group having 1 to 20 Carbon atoms, or a branched or cyclic alkyl, alkoxy or thioalkoxy group or a silyl group having 3 to 20 Carbon atoms, or a substituted keto group having 1 to 20 Carbon atoms, an alkoxycarbonyl group having 2 to 20 Carbon atoms, an aryloxycarbonyl group having 7 to 20 Carbon atoms, a cyano group (—CN), a carbamoyl group (—C(=O)NH2), a haloformyl group (—C(=O)—X, wherein X represents a halogen atom), a formyl group (—C(=O)—H), an isocyano group, an isocyanate group, a thiocyanate group or an isothiocyanate group, a hydroxyl group, a nitro group, a CF3 group, a Cl, a Br, an F, a crosslinkable group or a substituted or unsubstituted aromatic or heteroaromatic ring system having 5 to 40 ring atoms, or an aryloxy or a heteroaryloxy group having 5 to 40 ring atoms, or a combination thereof.

4. The printing ink according to claim 1, wherein a luminescence wavelength of the at least one luminescent quantum dot material is between 380 nm and 2500 nm.

5. The printing ink according to claim 1, wherein the inorganic nano-material is a binary or multiple semiconductor compound quantum dots or a mixture thereof, in a group IV, a group II-VI, a group II-V, a group III-V, a group III-VI, a group IV-VI, a group I-III-VI, a group II-IV-VI, a group II-IV-V of a Periodic Table.

6. The printing ink according to claim 1, further comprises at least one organic functional material, wherein the organic functional material is selected from: a hole injection material (HIM), a hole transport material (HTM), an electron transport material (ETM), an electron injection material (EIM), an electrons barrier material (EBM), a hole blocking material (HBM), a light emitter (Emitter), and a host material (Host).

7. The printing ink according to claim 1, wherein a weight ratio of the inorganic nano-material is from 0.3% to 70%, and a weight ratio of the ester-based organic solvent is from 30% to 99.7%.

8. The printing ink according to claim 1, wherein the ester-based organic solvent is selected from an_octanoic acid alkyl ester, an alkyl ester sebacate, an alkyl ester stearate, an alkyl ester benzoate, an alkyl ester phenylacetate, an alkyl ester cinnamate, an alkyl ester oxalate, an alkyl ester_maleate, an alkyl ester lactone, an alkyl ester oleate, or a mixture of at least two thereof.

9. The printing ink according to claim 8, wherein the ester-based organic solvent is selected from or mainly selected from an octyl octanoate, a diethyl sebacate or a mixture thereof.

10. The printing ink according to claim 9, wherein the ester-based organic solvent further comprises at least one other ester, the other ester comprises a diallyl phthalate, an isononyl isononanoate, or a mixture thereof, a total weight of the other ester in the ester solvent is less than 50%.

\* \* \* \* \*